United States Patent [19]

Vistica

[11] Patent Number: 4,947,338
[45] Date of Patent: Aug. 7, 1990

[54] SIGNAL IDENTIFICATION METHOD
[75] Inventor: Robert S. Vistica, Aloha, Oreg.
[73] Assignee: Tektronix, Inc., Beaverton, Oreg.
[21] Appl. No.: 899,272
[22] Filed: Aug. 22, 1986
[51] Int. Cl.[5] ............................................. G01R 23/16
[52] U.S. Cl. .................................... 364/485; 364/487; 324/77 B
[58] Field of Search ........................ 364/481, 484–487; 324/78 R, 77 A, 77 B, 77 CS; 371/22

[56] References Cited

U.S. PATENT DOCUMENTS

| | | | |
|---|---|---|---|
| 4,301,356 | 11/1981 | Favin et al. | 371/22 |
| 4,333,150 | 6/1982 | Matty et al. | 364/484 |
| 4,455,613 | 6/1984 | Shoemaker | 364/487 |
| 4,507,740 | 3/1985 | Star et al. | 364/487 |
| 4,568,878 | 2/1986 | Bales | 324/77 B |
| 4,578,638 | 3/1986 | Takano et al. | 324/77 B |
| 4,611,164 | 9/1986 | Mitsuyoshi et al. | 324/77 B |

*Primary Examiner*—Parshotam S. Lall
*Assistant Examiner*—Brian M. Mattson
*Attorney, Agent, or Firm*—Francis I. Gray

[57] ABSTRACT

A signal processing method for identifying the type of a stored, digitized acquired signal according to a selected operating mode applies a hierarchy of tests to the stored data. The tests applied are determined by the selected operating mode—SPUR, PULSE or CW. Tests for threshold and width are applied in all operating modes, tests for left and right maximum values are applied in the PULSE mode, and a bandwidth test is additionally applied in the CW mode. Thus other signals than CW can be identified.

9 Claims, 5 Drawing Sheets

SIGNAL IDENTIFICATION METHOD

BACKGROUND OF THE INVENTION

The present invention relates to signal processing methods, and more particularly to a signal identification method which handles a variety of signals.

Signal processing routines were first incorporated into spectrum analyzers in the late 1970s. These routines define a signal to be a peak and two additional points, one on each side of the peak, that are located 3dB below the peak. The distance between the two side points must match the bandwidth of the resolution bandwidth filter used. If the signal is too narrow, it will not be identified. For example the signal processing routine will identify a continuous wave (CW) signal, but not a pulsed radio frequency (RF) signal nor a spurious or impulse signal.

What is desired is a means for identifying a variety of signals at the user's option.

SUMMARY OF THE INVENTION

Accordingly, the present invention provides a signal identification method which allows a user to identify different types of signals. A plurality of tests are performed in a hierarchy, the number of tests being performed for any signal measurement being determined by an operating mode selected by a user. Acquired digital data representative of a signal to be measured is stored in a memory where the address is equivalent to frequency, and the value is equivalent to amplitude. For a spurious or impulse mode of operation, a threshold and a width test are performed on the data to assure a valid pulse. Additionally in a pulsed RF operating mode, the next peak of the input signal is determined by searching the data in either direction from a starting point (frequency) to find an equal to or greater value within a search range, and if no such value is located, then searching to the opposite direction to find an equal to or greater value, indicating that the data is related to the old peak. Finally in a CW operating mode, a final test is made to determine that the bandwidth at the 3dB down from the peak point is equal to or greater than a specified value.

The objects, advantages and novel features of the present invention will be apparent from the following detailed description when read in conjunction with the appended claims and attached drawings.

DESCRIPTION OF THE PREFERRED EMBODIMENT

Figure 1:
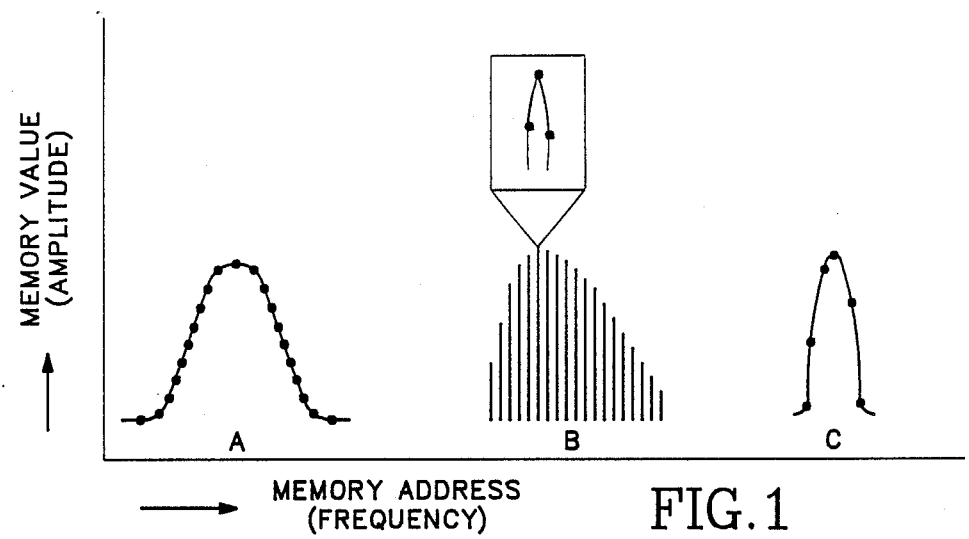
FIG. 1 is an illustration of three types of waveforms to be identified by the present invention.

Referring now to FIG. 1, different waveforms are shown as they might appear on a typical spectrum analyzer display. The three types of waveforms are a CW signal "A", an RF pulse signal "B" and a spurious or impulse signal "C". Each waveform is composed of a plurality of data points stored in a digital memory as indicated roughly by the dark points. The frequency of the signal is indicated by sequential memory addresses, and the amplitude for a given frequency, or memory address, is indicated by the value stored therein. As is apparent, the width of the signal C is less than that of signal A, and under the prior art which applies a minimum bandwidth criteria, the signal C would be ignored, as would signal B.

The algorithm according to the present invention uses five tests in a hierarchy configuration to identify signals according to the operating mode selected by a user since no one algorithm can identify all signals. For the types of signals illustrated, there are three operating modes–SPUR, PULSE and CW. In the SPUR operating mode, each pulse within the frequency spectrum will be processed and identified; in the PULSE operating mode each group of pulses which make up an RF pulse signal will be processed and identified; and in the CW operating mode, each pulse which is a CW signal will be identified. All operating modes use the first two tests, the PULSE operating mode adds two additional tests, and the CW operating mode adds a fifth test.

Figures 2, 3:
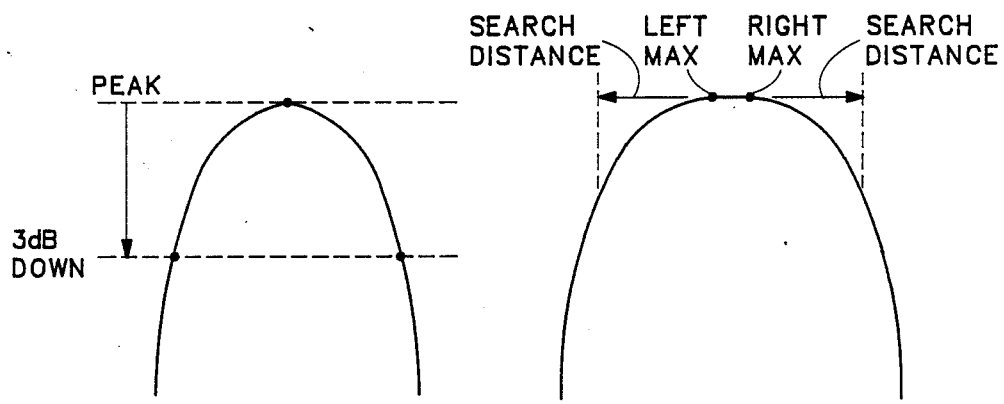
FIG. 2 is an illustration of one of the tests performed by the method of the present invention.
FIG. 3 is an illustration of further tests performed by the method of the present invention.

The first test checks the peak amplitude to determine whether it is greater than or equal to a given threshold value. The threshold value may be set to an absolute value by the user or to an automatic level which is just above the internal noise of the instrument. The second test, as shown in FIG. 2, checks to determine that there are two points, one on each side of the peak value, that are located 3dB below the peak. The frequency spacing of these points does not matter, so pulses which satisfy these two tests will be identified even though not a CW pulse.

The third and fourth tests use a search distance. This is the frequency width on each side of the candidate data point which is searched for a value, or peak, of equal or greater amplitude, as shown in FIG. 3. The "left" and "right" maximums, which define the horizontal range over which the display has the same value or over which the peaks have the same amplitude, are stored. As an example, the search distance may be ¼ of the resolution bandwidth or 4% of the display width, whichever is greater. Test three checks to determine whether there is a peak of the same or higher amplitude within the search distance to the "right", i.e. at higher frequencies as commonly displayed. If there is a value that is the same, store the old address, or frequency, as the "left" maximum and store the new address, or frequency, as the "right" maximum. If there is a value which is greater, make it both the left and right maximum and redo the second test. This test causes the instrument to search to the right for the next peak value. If there is no new right maximum, then test four checks to determine whether there is a peak of equal or greater amplitude within the search distance to the left of the left maximum. If there is, this indicates that the left maximum is on the downside of the old peak and that the next peak has not been identified. The search loop is restarted from the first test by looking for a new minimum and then a new maximum, indicating the next peak.

Finally in the CW operating mode, the fifth test checks the distance between the two 3dB down points to determine whether the distance is equal to or greater than a predetermined bandwidth, typically ½ the resolution bandwidth, as in the prior art.

Thus by selecting the SPUR operating mode, the user can move from pulse to pulse along the frequency spectrum and examine each such pulse. By selecting the PULSE operating mode, the user can move from peak to peak of groups of pulses which define an RF pulsed signal. Finally by selecting the CW operating mode, the user can move from one CW pulse to the next, ignoring the spurious and RF pulsed signals.

Figure 4:
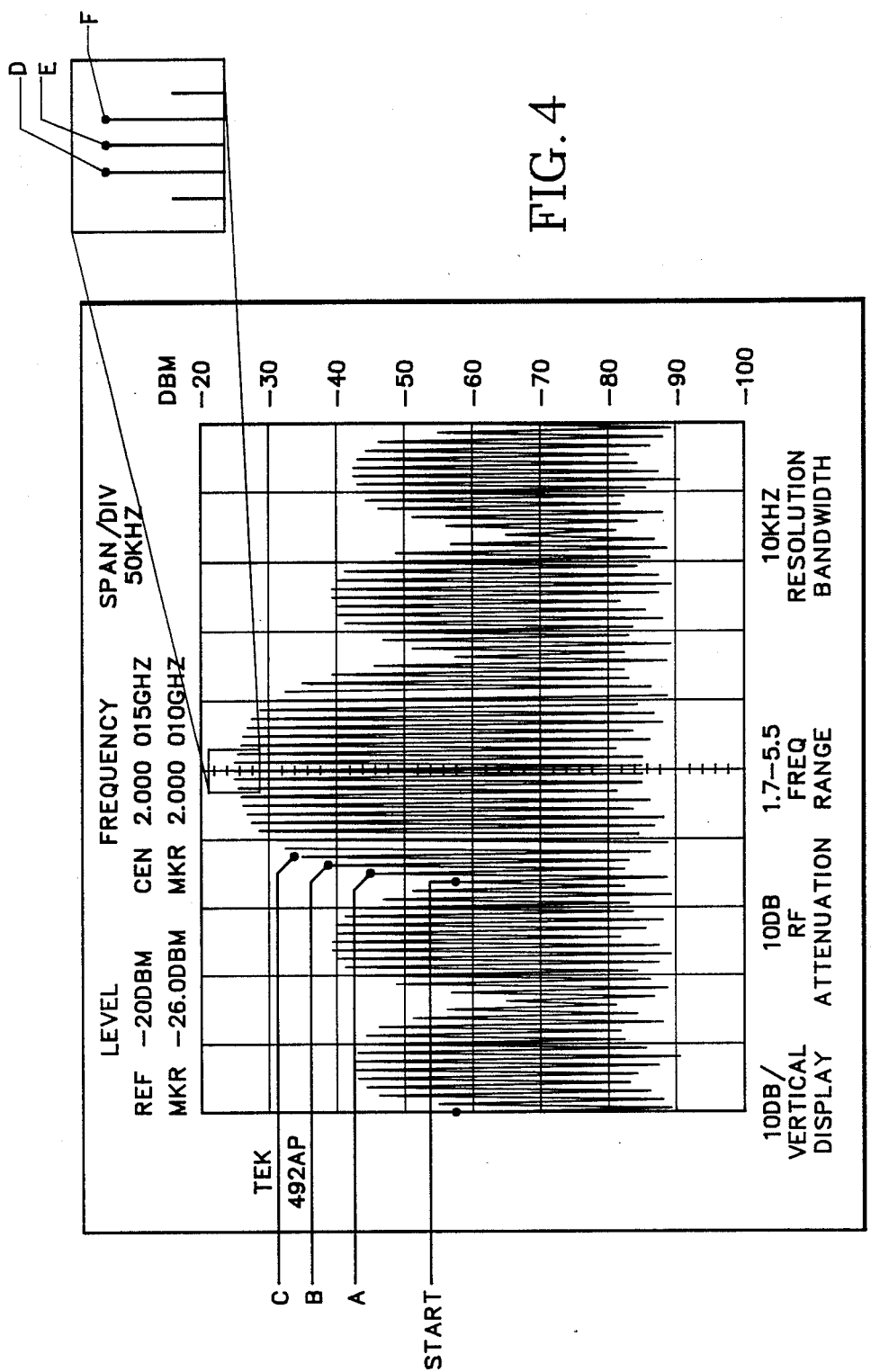
FIG. 4 is an illustration of the three operating modes of the present invention in conjunction with a realistic signal.

Referring now to FIG. 4, examples of all three operating modes will be described. A cursor, represented by the heavy dot labeled START, defines the starting point. Searching for peaks from left to right, the peak labeled "A" is the first peak to satisfy the threshold and width criteria of tests one and two. Therefore in the SPUR operating mode, peak A is the next signal to the right. In the PULSE operating mode, peak "A" is again the first peak to meet tests one and two. However, test three is not met because peak "B" is within the search distance from peak "A". Since peak "B" is higher than peak "A", the address index moves to peak "B" and the left and right maximums are set to peak "B". Tests one and two are redone, both tests being passed. Again, test three fails because a higher peak is found within the search distance. This sequence repeats until the index gets to peak "D". Peak "D" meets the first and second tests, but in test three peak "E" is found which has the same value as peak "D". Therefore, peak "D" is stored as the left maximum and peak "E" is stored as the right maximum. Test three is repeated and peak "F" is found with the same value and is stored as the new right maximum. Since there are no more peaks to the right of peak "F" with the same or higher value, the fourth test is applied to the left maximum, i.e. peak "D", which passes. Since the left maximum and right maximum are at different indices, i.e. different frequencies, the center most maximum peak is now determined.

If the starting point for the search was to the right of the peak defined by peaks "D", "E" and "F", i.e. the cursor START was to the right of peak "F", test three would be passed, but test four would find a peak to the left greater than the present peak. This would cause the signal processing to return to test one for the next peak, reiterating tests one through four until the next maximum peak was attained.

In the CW operating mode, peak "A" meets the first and second tests, as well as the third and fourth tests due to the small search distance involved.

However, the fifth test is not satisfied since the two 3dB points are less than the predetermined bandwidth apart. Likewise, the fifth test fails for each peak shown in FIG. 4. Therefore, there are no CW signals present.

Figure 5:
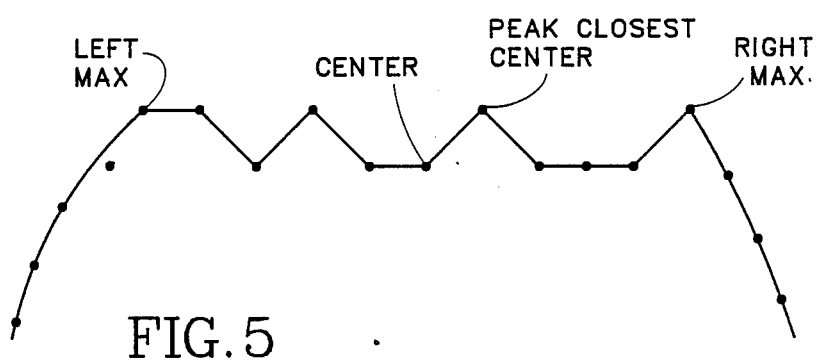
FIG. 5 is an illustration of the method for determining the location of the actual center of the peak according to the present invention.

The process for determining the center of the signal peak in any of the three operating modes is illustrated in FIG. 5, with the exact center being determined by:

EXACT.CENTER=left-max×½(right-max−left-max).

If this location is equal to the maximum value, then it is the center. If it is not equal to the maximum value, then the center of the signal is the closest point to the exact center which has a value equal to the maximum value.

Figure 6A:
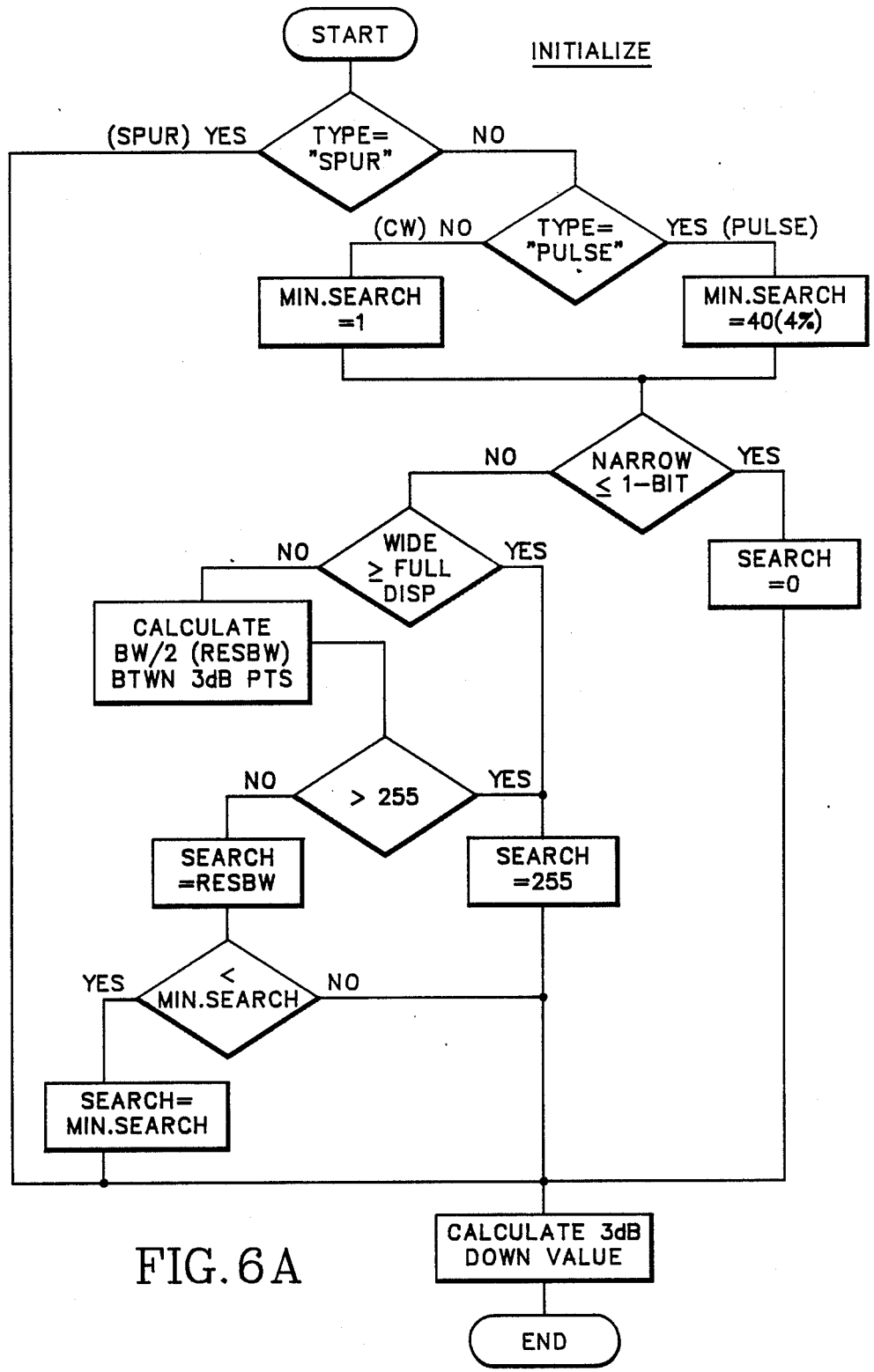
FIGS. 6A, 6B and 6C together illustrate a flow chart of the operation of the present invention.

The operation of the present invention will now be described in greater detail with reference to FIGS. 6A, 6B and 6C. FIG. 6A illustrates an initial signal search which makes use of user defined parameters for the display. The first check determines whether the SPUR operating mode has been selected, and, if it has, the search distance SEARCH is set to one. If SPUR has not been selected, then the next check determines whether the selected operating mode is PULSE or CW. If the operating mode is PULSE, a minimum search distance MIN.SEARCH is established at some value, such as four percent (4%) of the total display width which for a display of one thousand (1,000) data points is forty (40) display points. Otherwise, MIN.SEARCH is set to one. If, due to the display settings selected by the user, the signals are only one bit or less in duration, i.e. supernarrow pulses, then SEARCH is set to zero, and if the signals completely fill or exceed the display width, then SEARCH is set to the maximum value of 255. If neither condition is found, then an actual value for SEARCH is calculated based upon the resolution bandwidth and span of the display selected by the user. The value for SEARCH is determined by calculating the required bandwidth between the 3dB down points to define a CW signal, and then dividing the bandwidth by two, i.e. SEARCH=100*RESBW/SPAN in display data points. If the calculated value for SEARCH is less than MIN.SEARCH, then the value for SEARCH is set to MIN.SEARCH. Finally, the 3dB down points, or vertical value corresponding to the 3dB down points, is calculated according to the dB/div selected by the user. This concludes the initial calculations of values for use by the remainder of the method.

Figure 6B:
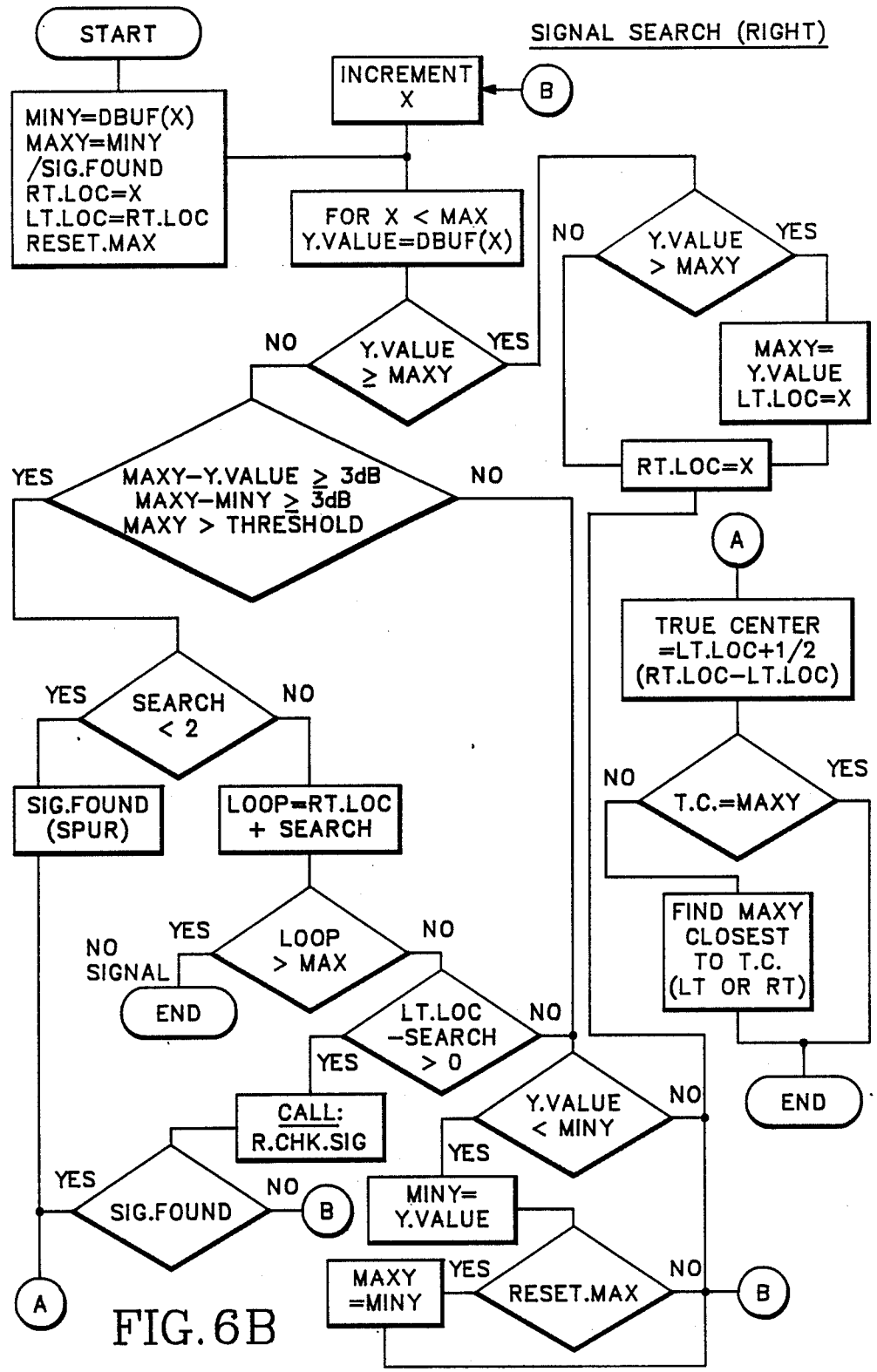
Figure 6C:
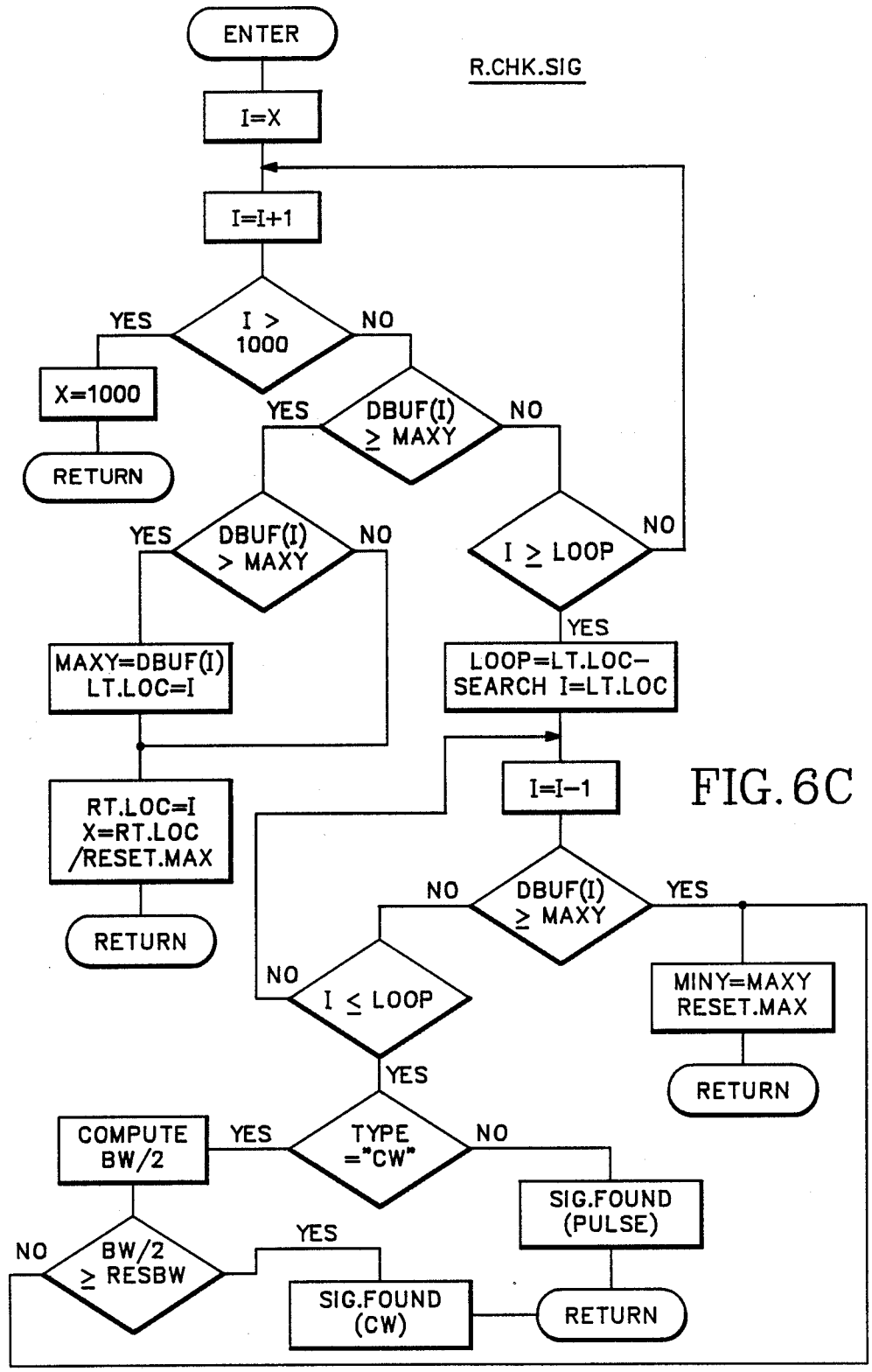

Now referring to FIG. 6B, the signal search is performed. The search may be performed either by searching to the right or to the left of a starting point defined by a cursor on the display set by the user. Only the SEARCH.RIGHT routine is described, as the SEARCH.LEFT is the mirror image. As long as the frequency as defined by the X location is within the display area, i.e. X less than MAX, the value from a display buffer array, having for example one thousand (1,000) data samples for a full display, is extracted for that frequency. If Y.VALUE is greater than a value MAXY, MAXY is set equal to Y.VALUE, and the left and right locations, LT.LOC and RT.LOC, are set equal to X, and if Y.VALUE is equal to MAXY, only RT.LOC is updated to X. X is then incremented, and the process is continued so long as the amplitude at successive locations is increasing.

If Y.VALUE is less than MAXY, then MAXY is tested to determine whether there are points on each side of the location of MAXY which are 3dB down from MAXY, i.e. a value of MINY which is equal to the value at the starting point, or some subsequent minimum value, is subtracted from MAXY, and the current Y.VALUE is subtracted from MAXY and, if both results are greater than or equal to the 3dB down value previously calculated, and if MAXY is above a predetermined THRESHOLD, then a test of SEARCH is made. Otherwise if Y.VALUE is less than MINY, a new value of MINY is established, X is incremented, and the next value from the display buffer is processed. If SEARCH is less than two, which is the case for SPUR operating mode, a signal is found, and SIG.FOUND is true. If SEARCH is two or greater, which is the case for PULSE and CW modes, the search span is tested between RT.LOC+SEARCH and LT.LOC−SEARCH to determine whether it is within the display area. If the search span is within the display area, a subroutine R.CHK.SIG, described hereinafter with reference to FIG. 6C, is called to check for peaks on each side of MAXY. R.CHK.SIG indicates whether SIG.FOUND is true after the peak checks.

If SIG.FOUND is true, the true center of the pulse is determined based upon the values of LT.LOC and RT.LOC. If the true center does not have a value of MAXY, then pointers are respectively incremented and decremented to find the nearest point to true center which is equal to MAXY, and that point is designated the center of the pulse.

R.CHK.SIG, and its corresponding counterpart L.CHK.SIG for searching to the left rather than to the right, looks for values of Y.VALUE within the search distance SEARCH about MAXY which are equal to or greater than MAXY to determine whether the true peak has been found. Then for the CW mode, a bandwidth check is also made. An INDEX is set equal to X, the current frequency location, and then incremented. So long as INDEX is within the display area, the value of the display at that location is compared with MAXY. If the value is less than MAXY, and INDEX is within the search range LOOP, INDEX is incremented and the next value in the display buffer is compared with MAXY. If the value is greater than MAXY, MAXY is updated, as are LT.LOC, RT.LOC and X, and if the value is equal to MAXY, then only RT.LOC and X are updated, and R.CHK.SIG returns to the calling routine.

If no new peak value within the search range LOOP is found to the right of MAXY, then the same procedure is followed in looking for a peak to the left of MAXY. If a value greater than or equal to MAXY is found within the search range to the left, then a flag RESET.MAX is set and MINY is set equal to MAXY to indicate that the next peak has not yet been found and R.CHK.SIG returns to the calling routine. If no such values are found, SIG.FOUND is set, and if the operating mode is CW, then a bandwidth check is performed. The actual bandwidth between the two 3dB down points is computed and compared with the calculated resolution bandwidth distance RESBW. If the comparison is equal to or greater than RESBW, then SIG.FOUND is set. Otherwise, MINY is set equal to MAXY, and the RESET.MAX flag is set to indicate no signal was found. R.CHK.SIG then returns to the calling routine which tests RESET.MAX to reinitialize the search if no signal has been found.

The method described above may be practiced on any suitable instrument which stores digital values of input signals in the form of frequency and amplitude values, and subsequently displays such data on a suitable display after processing by a microprocessor or the like. Such an instrument is a spectrum analyzer as described in U.S. Pat. No. 4,568,878 issued Feb. 4, 1986 to Robert W. Bales entitled "Spectrum Analyzers".

Thus the present invention provides a method for processing a signal according to three different operating modes to identify the type of signal by applying a hierarchy of tests according to the operating mode selected by the user.

What is claimed is:

1. A signal identification method comprising the steps of:
    selecting one or more tests to apply to digital data points stored in a display memory having a plurality of sequential display memory addresses, the tests being selected from a plurality of tests arranged in a hierarchy according to an operating mode selected from a plurality of operating modes, the digital data points being stored such that each sequential display memory address represents a particular sequential frequency and the value of the digital data point stored at each sequential display memory address represents an amplitude value for the represented frequency, the digital data points representing a frequency spectrum for an acquired input signal; and
    processing the digital data points according to the selected tests and predetermined display parameters in order to identify the acquired input signal according to the selected operating mode.

2. A signal identification method as recited in claim 1 wherein the plurality of tests comprise:
    a first test to determine if the value of a selected digital data point from the display memory is above a threshold value and has digital data points on each side of the selected digital data point having a value equal to or less than the value of the selected digital data point decremented by an incremental value, the first test being performed for all selected operating modes and identifying the acquired input signal if a first operating mode is selected;
    a second test, applied to the selected digital data point after the first test is completed, if a second operating mode is selected, to determine if there are digital data points on either side of the selected digital data point within a search span having a value equal to or greater than the value of the selected digital data point, identifying the acquired input signal if no such digital data points exist; and
    a third test, applied to the selected digital data point after the first and second tests are completed, if a third operating mode is selected, to determine if a bandwidth about the selected digital data point is equal to or greater than a predetermined bandwidth to identify the acquired input signal.

3. A signal identification method comprising the steps of:
    initially computing, based upon a signal operating mode selected from a plurality of signal operating modes and upon a plurality of selected display parameters, a search span for the selected signal operating mode, an increment value equal to a specified incremental amplitude and a resolution bandwidth computed from the selected display parameters; and
    searching from an initial selected data point a plurality of data points stored in a display memory, the display memory having a plurality of sequential addresses representing sequential discrete frequency values and the value of the data point at each address representing an amplitude value, to identify a signal represented by the data points according to one or more tests selected from a hierarchy of tests which are applied to the data points, the selected tests being determined by the selected signal operating mode.

4. The signal identification method of claim 3 wherein the searching step comprises for all selected signal operating modes the steps of:
    comparing the amplitude for a specified frequency with a maximum value determined at a previous frequency;
    determining whether, if the amplitude is less than the maximum value, the maximum value exceeds a threshold value and has data points at frequencies on either side of the previous frequency at least the increment value less than the maximum value; and testing the search span, if the determining step is true, to determine if a signal is identified according to a first selected signal operating mode.

5. The signal identification method of claim 4 wherein the searching step further comprises the steps of:
   storing left and right location markers to indicate a frequency range of data points having values equal to the maximum value if the value for the specified frequency is determined by the comparing step to be greater than or equal to the maximum value, making the specified frequency the previous frequency if the value of the specified frequency is greater than the maximum value;
   incrementing the specified frequency; and
   repeating the comparing, determining, testing, storing and incrementing steps until a signal is identified.

6. A signal identification method as recited in claim 5 wherein the searching step further comprises the steps of:
   locating from the left and right location markers a true center frequency of the signal if a signal is identified; and
   finding the maximum value closest to the true center frequency if the amplitude of the true center frequency is less than the maximum value.

7. A signal identification method as recited in claim 4 wherein the searching step further comprises for a second selected signal operating mode the steps of:
   examining the search span if a signal is not yet identified to determine whether the search span is encompassed within the display memory;
   performing an adjacent peak check within the search span if the search span is encompassed within the display memory to determine whether a signal is identified;
   incrementing the specified frequency; and
   repeating the comparing, determining, testing, examining, performing and incrementing steps until a signal is identified or the data points within the display memory are exhausted.

8. A signal identification method as recited in claim 7 wherein the performing step comprises the steps of:
   analyzing the data points in one direction from the maximum value to determine whether there are additional data points within the search span with values equal to or greater than the maximum value;
   analyzing the data points in the opposite direction from the maximum value to determine whether there are additional data points within the search span with values equal to or greater than the maximum value; and
   indicating that a signal has been identified if no additional data points within the search span on either side of the maximum value are identified.

9. A signal identification method as recited in claim 8 wherein the performing step further comprises for a third selected signal operating mode the steps of:
   computing a bandwidth between the data points on either side of the maximum value which are less than the maximum value by an amount at least equal to the increment value; and
   comparing the bandwidth with the resolution bandwidth to identify a signal found if the bandwidth is greater than or equal to the resolution bandwidth.

* * * * *